(12) United States Patent
Yellapantula et al.

(10) Patent No.: US 8,312,329 B1
(45) Date of Patent: Nov. 13, 2012

(54) SYSTEM AND METHOD FOR USING A SINGLE VECTOR SIGNAL GENERATOR TO VERIFY DEVICE UNDER TEST

(75) Inventors: Ramakrishna Yellapantula, Libertyville, IL (US); Yinghui Li, Cupertino, CA (US); Dirk J. M. Walvis, Santa Cruz, CA (US)

(73) Assignee: Litepoint Corporation, Sunnyvale, CA (US)

( * ) Notice: Subject to any disclaimer, the term of this patent is extended or adjusted under 35 U.S.C. 154(b) by 0 days.

(21) Appl. No.: 13/158,870

(22) Filed: Jun. 13, 2011

(51) Int. Cl.
*G06F 11/00* (2006.01)
*G01R 31/28* (2006.01)
*H03M 13/00* (2006.01)
(52) U.S. Cl. ......... 714/704; 714/712; 714/752; 714/758
(58) Field of Classification Search .................. 714/704, 714/708, 712, 746, 752, 755, 758, 784, 819, 714/821–822, 43, 48; 341/94, 143
See application file for complete search history.

(56) References Cited

U.S. PATENT DOCUMENTS

| | | | |
|---|---|---|---|
| 4,833,676 A | | 5/1989 | Koo |
| 4,897,842 A | | 1/1990 | Herz |
| 5,138,608 A | | 8/1992 | Kucera et al. |
| 5,361,266 A | * | 11/1994 | Kodama et al. ............ 714/758 |
| 5,384,786 A | * | 1/1995 | Dudley et al. ............. 714/784 |
| 5,910,977 A | | 6/1999 | Torregrossa |
| 6,333,704 B1 | * | 12/2001 | Jung et al. ............ 341/58 |
| 6,366,223 B1 | * | 4/2002 | Lee et al. ............ 341/51 |
| 6,753,693 B2 | | 6/2004 | Seo et al. |
| 6,870,392 B2 | | 3/2005 | Kilian et al. |
| 6,896,086 B2 | | 5/2005 | Ishizaki |
| 7,057,518 B2 | | 6/2006 | Schmidt |
| 7,463,140 B2 | | 12/2008 | Schmidt |
| 7,564,893 B2 | | 7/2009 | O'Neill |
| 7,890,822 B2 | | 2/2011 | Behziz et al. |

\* cited by examiner

*Primary Examiner* — Christine Tu (57) ABSTRACT

A system and method is disclosed for testing a communication device. In accordance with the described invention, a single vector signal generator (VSG) is utilized to test manufactured 2x2, 3x2 and 4x2 MIMO wireless devices to identify possible manufacturing defects that may impair or disable the device under test (DUT) receivers from properly receiving constituted MIMO TX signals and accurately decoding the bits/symbols conveyed by transmitted TX signals. Disclosed embodiments may include a VSG coupled to a DUT. The VSG being configured to transmit data packets as a first codeword and a second codeword, wherein the VSG includes software and hardware architecture to manipulate the first codeword and the second codeword as emulated first and second waveforms, wherein the first waveform is different than the second waveform. The DUT being configured to receive the emulated first and second waveforms as prescribed signals from the VSG. The prescribed signals including a first received signal and a second received signal, wherein the DUT includes software and hardware architecture to manipulate the first received signal and the second received signal to generate block error rate results therefrom.

14 Claims, 5 Drawing Sheets

| ITEM # | DESCRIPTION | VALUE |
|---|---|---|
| | | 302 |
| | 306  304 | |
| 1 | 1 BIT: RESOURCE ALLOCATION | 0X0 |
| 2 | 17 BITS: RB ASSIGNMENT FOR 10 MHZ BW | 0X1FFFF |
| 3 | 2 BITS: TPC COMMAND FOR PUCCH | 0X1 |
| 4 | 0 BITS: DOWNLINK ASSIGNMENT INDEX | - |
| 5 | 3 BITS: HARQ PROCESS NUMBER | 0X0 |
| 6 | 1 BIT: TB TO CODEWORD SWAP FLAG | 0X0 |
| 7 | 5 BITS: MCS FOR CW0 (QPSK 4392) | 0X5 |
| 8 | 1 BITS: NDI FOR CW0 | 0X1 |
| 9 | 2 BITS: RV FOR CW0 | 0X0 |
| 10 | 5 BITS: MCS FOR CW1 (QPSK 4392) | 0X5 |
| 11 | 1 BITS: NDI FOR CW1 | 0X1 |
| 12 | 2 BITS: RV FOR CW1 | 0X0 |
| 13 | 3 BITS: PRECODING INFO FOR 2 TX ANTENNAS. SEE 3GPP 36.212 TABLE 5.3.3.1.5-4 | 0X0 |

SYSTEM AND METHOD FOR USING A SINGLE VECTOR SIGNAL GENERATOR TO VERIFY DEVICE UNDER TEST

TECHNICAL FIELD

The present invention relates generally to systems and methods for testing electronic devices. More particularly, it relates to improvements in systems and methods for testing wireless devices using test platforms consisting of hardware, firmware and/or software components to determine block error rate.

BACKGROUND

Many of today's handheld devices make use of wireless "connections" for telephony, digital data transfer, geographical positioning, and the like. Despite differences in frequency spectra, modulation methods, and spectral power densities, the wireless connectivity standards use synchronized data packets to transmit and receive data.

In general, all of these wireless-connectivity capabilities (e.g. WiFi, WiMAX, Bluetooth, etc.) are defined by industry-approved standards (e.g. IEEE 802.11, IEEE 802.16) and cellular industry consortium-based standards (e.g. 3GPP LTE) which specify the parameters and limits to which devices having those connectivity capabilities must adhere.

At any point along the device-development continuum, it may be necessary to test and verify that a device is operating within its standards' specifications. Most such devices are transceivers, that is, they transmit and receive wireless RF signals. Specialized systems designed for testing such devices typically contain subsystems designed to receive and analyze device-transmitted signals, and to send signals that subscribe to industry-approved standards so as to determine whether a device is receiving and processing the wireless signals in accordance with its standard.

In the development of radio technology, one advancement of several forms of smart antenna technology includes multiple-input and multiple-output, or MIMO. MIMO utilizes multiple antennas at both the transmitter and receiver (either or both) to improve communication performance; i.e., in order to multiply throughput of a radio link, multiple antennas (and multiple RF chains accordingly) are put at both the transmitter and the receiver. A MIMO system with a similar count of antennas at both the transmitter and the receiver in a point-to-point (PTP) link is able to multiply the system throughput linearly with every additional antenna under favorable conditions. For example, a 2x2 MIMO can double the throughput.

MIMO may employ Spatial Multiplexing (SM) to enable signals (coded and modulated data stream) to be transmitted across different independent spatial domains. Meanwhile, Mobile WiMAX supports multiple MIMO modes, that's using either SM or STC (Space Time Coding) or both to maximize spectral efficiency (increase throughput) without shrinking the coverage area. The dynamic switching between these modes based on channel conditions is called Adaptive MIMO Switching (AMS). If combined with an AAS (Adaptive Antenna System), MIMO can further boost WiMAX performance.

With the advent of bandwidth-hungry broadband users, it has become desirable to implement MIMO technology within many wireless technologies (e.g., PAN, LAN, MAN, and WAN) to address an ever-growing need to increase data rates multiple times. MIMO technology has attracted attention in wireless communications, because it offers significant increases in data throughput and link range without additional bandwidth or transmit power. It achieves this by higher spectral efficiency (more bits per second per hertz of bandwidth) and link reliability or diversity (reduced fading). Because of these properties, MIMO is an important part of modern wireless communication standards such as IEEE 802.11n (Wifi), 4G, 3GPP Long Term Evolution (LTE), WiMAX and HSPA+.

Figure 1:
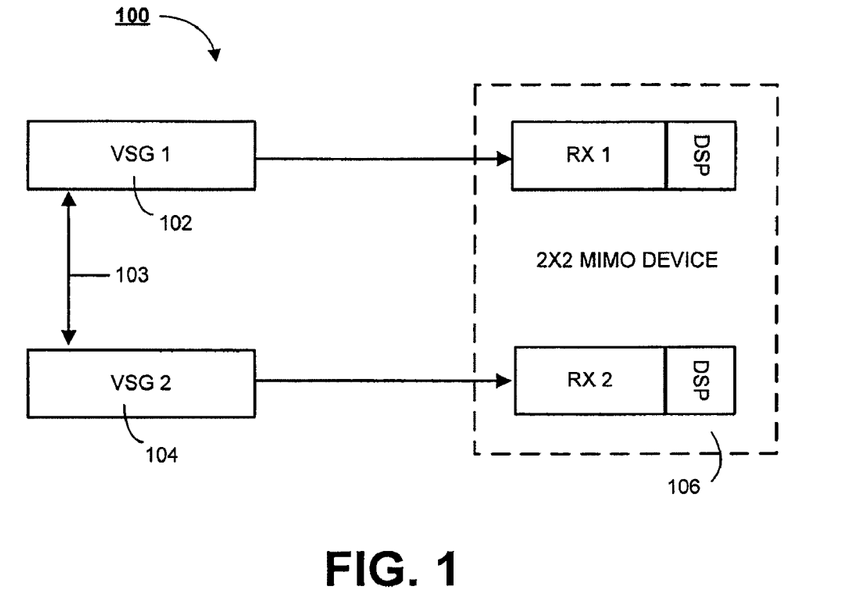
FIG. 1 is a conventional system for testing a 2x2 MIMO wireless MIMO device using synchronized vector signal generators.

At some point, it is necessary to test and verify a device designed for employing a MIMO system. For example, FIG. 1 illustrates a conventional system 100 employing a standard for fully testing a 2x2 MIMO wireless MIMO device using synchronized 103 vector signal generators (VSGs) 102, 104. In the case of a device 106 designed for two RX/two TX MIMO (e.g. 2x2 MIMO), one could fully test its physical-layer (PHY) characteristics using a testing system having two vector signal analyzers (VSAs) for testing concurrently the two MIMO TX signals. In addition, one could also test using two VSGs for simulating two independent TX MIMO signals for testing the device's two receivers.

In this manner, one is able to test the RX1/digital signal processor (DSP) chain and the RX2/DSP chain of a device under test (DUT) 106 to determine if it is working properly. Having verified the correct operation of the 2x2 DUT's two receive chains using two VSGs, the conventional method may also allow both the verification of the RX chains and MIMO channel estimation. However, the cost of a test system is generally dominated by the costs of the implemented equipment, such as the VSAs and VSGs employed in this instance. Hence, as a practical matter, the more testing equipment employed within a wireless-connectivity test system, the more expensive the aforementioned system tends to be. Furthermore, there may also be expenditures associated with each piece of testing equipment for checking reliability and/or maintenance applications. It would, therefore, be desirable to reduce expenditures related to devices utilized in testing systems while still maintaining reliable testing methods of the implemented equipment.

Figure 2:
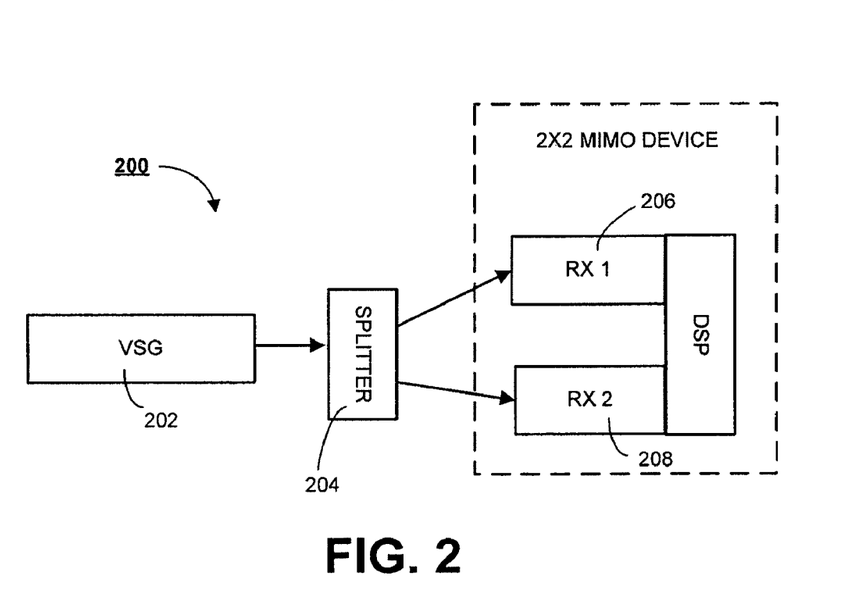
FIG. 2 illustrates a testing system for splitting the output of a single VSG into two identical signals.

Attempts have been made to address limiting the components of testing equipment, and hence, the associated cost factors. For example, the conventional embodiment of FIG. 2 employs a testing system 200 by simply taking a single VSG 202 and splitting 204 its output into two identical signals. However, this procedure does not adequately test the capabilities of the two DUT receivers 206, 208. Attempting to use a single VSG 202, in this manner, by splitting the output to provide verification of the RX chain and channel estimation fails to verify both RX chains. This is because, inter alia, the employed procedure merely measures the average of the resulting two noise figures rather than each individual noise figure. As a result, the instant method does not verify the channel estimation which is critical to proper processing of spatial multiplexing (SM) in a MIMO system. In short, the method fails to provide a complete accounting of the testing signal by fully testing both RX1/DSP and RX2/DSP chains. Thus, one would only verify a single DSP chain (instead of the two) and also fail to verify MIMO channel estimation.

Accordingly, a need exists for an improved reduced-cost testing system which meets or exceeds the requirements of leading wireless-connectivity capabilities. This need provides an improved functionality to test manufactured 2x2, 3x2 and 4x2 MIMO wireless devices. A further need exists to reduce the reliance on additional testing equipment, thereby reducing operational costs, to perform tests for identifying defects in wireless equipment and determine block error rate information.

SUMMARY OF THE INVENTION

It is, therefore, an object of the present invention to overcome the deficiencies of the prior art to include a system and method for using a test system preferably comprising a single VSG that enables testing of manufactured 2x2, 3x2 and 4x2 MIMO wireless devices to identify possible manufacturing defects that may impair or disable DUT receivers from properly receiving constituted MIMO TX signals and accurately decoding the bits/symbols conveyed by transmitted TX signals.

In accordance with one disclosed exemplary embodiment, a method of testing a communication device is provided that in some embodiments comprises transmitting data packets as a first codeword and a second codeword from a vector signal generator (VSG) to a device under test (DUT). The method may include manipulating the first codeword and the second codeword by precoding the first codeword and the second codeword and generating a first output signal and a second output signal from the manipulated first codeword and second codeword, respectively, wherein the first output signal is different than the second output signal. Additional embodiments may include receiving a first signal from the VSG with the DUT, wherein the first received signal of the DUT is a summation of the first output signal and second output signal of the VSG. Furthermore, a second signal may be received from the VSG with the DUT, wherein the second received signal of the DUT is a summation of the first output signal and second output signal of the VSG. The method may additionally include manipulating the first received signal of the DUT and the second received signal of the DUT by precoding the first received signal and the second received signal. Block error rate results may be generated from the manipulated first received signal of the DUT and the manipulated second received signal of the DUT.

In accordance with another disclosed exemplary embodiment, a system for testing a communication device is provided that in some embodiments comprises a means for transmitting data packets as a first codeword and a second codeword from a vector signal generator (VSG) to a device under test (DUT). The system may also include a means for manipulating the first codeword and the second codeword to produce a first output signal and a second output signal, respectively, wherein the first output signal is different than the second output signal. Additionally, a means for receiving a first signal from the VSG with the DUT may be included, wherein the first received signal of the DUT is a summation of the first output signal and second output signal of the VSG. The system includes a means for receiving a second signal from the VSG with the DUT, wherein the second received signal of the DUT is a summation of the first output signal and second output signal of the VSG. Furthermore, a means for manipulating the first received signal of the DUT and the second received signal of the DUT to generate block error rate results for the first received signal of the DUT and the second received signal of the DUT may also be included.

In accordance with yet another disclosed exemplary embodiment, a system for testing a communication device is provided that in some embodiments comprises a VSG coupled to a DUT. The VSG is configured to transmit data packets as a first codeword and a second codeword, wherein the VSG includes software and hardware architecture to manipulate the first codeword and the second codeword as emulated first and second waveforms, wherein the first waveform is different than the second waveform. The DUT is configured to receive the emulated first and second waveforms as prescribed signals from the VSG. The prescribed signals include a first received signal and a second received signal, wherein the DUT includes software and hardware architecture to manipulate the first received signal and the second received signal to generate block error rate results therefrom.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

Still other aspects, features and advantages of the present invention are readily apparent from the following detailed description, simply by illustrating a number of exemplary embodiments and implementations, including the best mode contemplated for carrying out the present invention. The present invention also is capable of other and different embodiments, and its several details can be modified in various respects, all without departing from the spirit and scope of the present invention. Accordingly, the drawings and descriptions are to be regarded as illustrative in nature, and not as restrictive.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF EMBODIMENTS

The invention will now be described with reference to the drawing figures, in which like reference numerals refer to like parts throughout. The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components which are either active and/or passive and are connected or otherwise coupled together (e.g., as one or more integrated circuit chips) to provide the described function. Additionally, the term "signal" may refer to one or more currents, one or more voltages, or a data signal. Within the drawing, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implements using one or more appropriately programmed processors, depending upon the signal frequencies or data rates to be processed.

The invention, described herein, provides a system and method for using a test system requiring fewer test components to verify defective components in a wireless system. Specifically, disclosed embodiments of the system and method employ a testing system comprising a single VSG that is configured and enabled to test manufactured 2x2 MIMO wireless devices to identify any manufacturing defects that impair or disable the DUT's receivers from receiving properly constituted MIMO TX signals. The disclosed testing system and method is further capable of accurately decoding the bits/symbols conveyed by the aforementioned TX signals. In this case, the described use of a 2x2 MIMO device, throughout this document, is meant to be based on the 3GPP LTE standard; however, the 2x2 MIMO device is meant to be exemplary. While the 2x2 MIMO DUT, expressed in the following description, is one that conforms to the LTE standard of 3GPP, it is readily appreciated that, with similar precoding and code-word techniques known to those practiced in the art, the employed system and method of the present invention is applicable to any 2x2 MIMO DUT RX chain and channel estimation verification testing procedure.

Accordingly, the disclosed system and method commands a tester, in accordance with selected criteria of the present invention, to generate an appropriate waveform from a single VSG. The thusly generated single VSG signals are used to verify both DSP chains and provide block error-rate testing that can identify a manufacturing defect affecting MIMO RX. The disclosed testing capability of the present invention is, at least, as comparable to conventional testing systems and methods which utilize additional equipment, such as two VSGs. However, by obviating the need for a second VSG, the disclosed system and method provide cost saving advantages by lowering the expenses of required testing apparatus to identify potential defects within the system.

Figure 3:
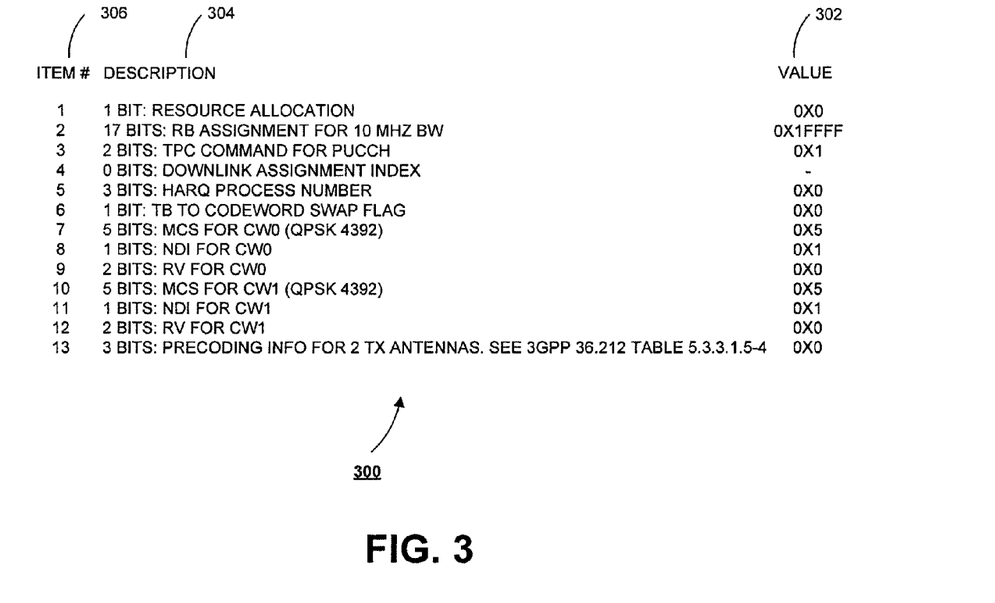
FIG. 3 illustrates a configuration table utilized for generating a VSG signal to command a DUT according to an exemplary disclosed embodiment.

In order to generate the single VSG waveform, the disclosed invention may employ an algorithm to command the DUT to exercise, for example, two decode chains. In one embodiment, a configuration table, such as one utilizing 3GPP LTE MIMO, may be employed by the disclosed system to generate the required VSG signal. FIG. 3 illustrates an example configuration table 300, used in 3GPP LTE MIMO, containing the values that may be used for generating the required VSG signal to command the DUT to exercise the two decode chains. The Downlink Control Information (DCI) format 2 table of FIG. 3 provides prescribed values 302 corresponding to respective descriptive items 304 which may, in this example, be listed as particular item numbers 306. The prescribed values 302 may be inputted to a tester or device that establishes how the tester or device operates. In a preferred embodiment, the DCI format 2 table supplies its value information to a single VSG which, in turn, produces a VSG waveform for fully testing a 2x2 MIMO DUT.

Figure 4:
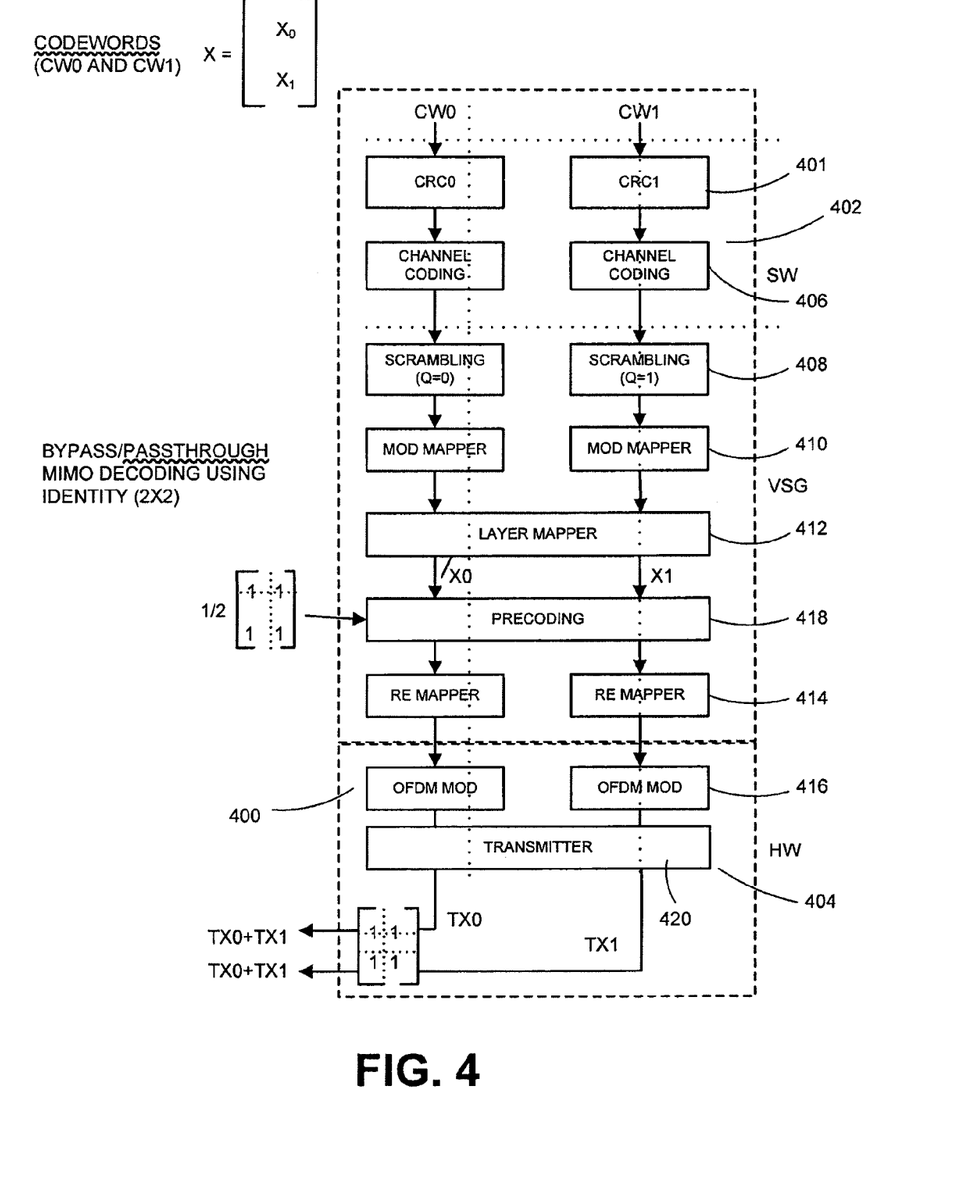
FIG. 4 illustrates a flow from code words CW0 and CW1 to the VSG generated waveforms according to an exemplary disclosed embodiment.

Referring to FIG. 4, a single VSG 400 utilizing the table values 302 from FIG. 3 employs a prescribed number of code words containing data embedded in transmitted packets. The code words proceed through several software-based 402 and hardware-based 404 processing steps to produce signals, for example, compatible with the 3GPP LTE 2x2 spatial multiplexing architecture. (As an alternative embodiment, the early processing steps 402 can also be hardware-based.) In this example, two code words (CW0 and CW1) are utilized and subjected to the aforementioned processing steps 402, 404 to generate waveforms TX0 and TX1. The code words may be manipulated, e.g., via software or hardware, to perform several operations including, for example, cyclic redundancy checking 401, channel coding 406 and scrambling 408 of the respective code words CW0 and CW1. In a preferred embodiment, the scrambling facilitates creation of the emulated signal by provide different values, such as q=0 for CW0 and q=1 for CW1. Code words CW0 and CW1 may be subjected to one or more additional operations, according to disclosed embodiments, including, for example, modulation mapping 410, layer mapping 412, RE mapping 414, and orthogonal frequency-division multiplexing (OFDM) modulation.

In a preferred embodiment, generation of the two output signals TX0 and TX1 requires precoding 418 of code words CW0 and CW1. During the precoding process, bypass/passthrough decoding is performed. The precoding operator may be set forth as:

$$\frac{1}{2}\begin{bmatrix} 1 & 1 \\ 1 & -1 \end{bmatrix}$$

based on the pseudo-inverse of the channel $$H = \begin{bmatrix} 1 & 1 \\ 1 & 1 \end{bmatrix}.$$

Upon this manipulation, the output of the VSG transmitter 420 generates two signals as TX0 and TX1. At the output stage of the VSG the channel is:

$$H = \begin{bmatrix} 1 & 1 \\ 1 & 1 \end{bmatrix}.$$

Thus, the output of the VSG produces identical output signals TX0+TX1 which become the input signals to the two receivers RX0, RX1.

Figure 5:
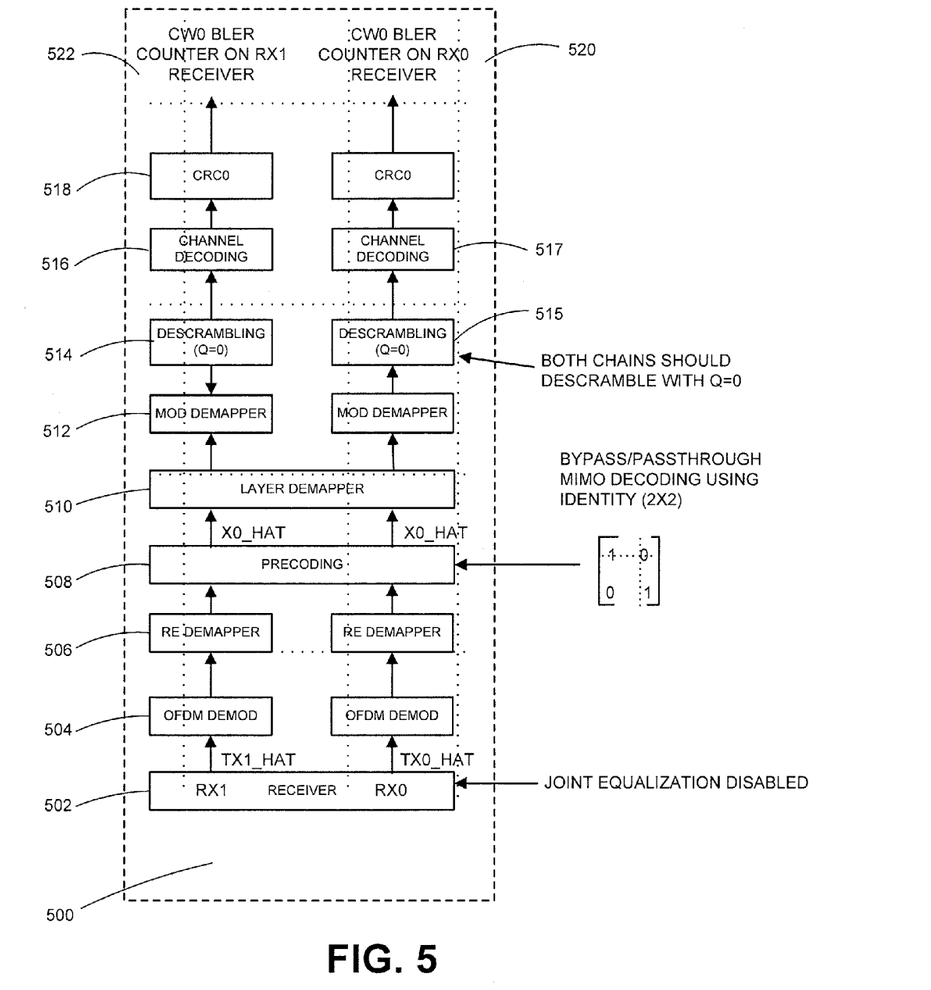
FIG. 5 illustrates a 2x2 MIMO DUT with precoding and descrambling chains coded to treat incoming VSG signals according to an exemplary disclosed embodiment.

Turning to FIG. 5, the signals, RX0 and RX1, which are transmitted to the two receivers 502 of the DUT 500 may be expressed as TX0+TX1 and TX0+TX1, respectively. The VSG signals RX0 and RX1 proceed up the processing chain from the receivers 502 and are subject to one or more additional processing such as through an orthogonal frequency-division multiplexing (OFDM) demodulation operation 504. Again, additional operations are performed to manipulate the signals RX0 and RX1, including, for example, RE demapping 506, and precoding 508. Here, during the precoding operation, the precoding operator may be set forth as:

$$\begin{bmatrix} 1 & 0 \\ 0 & 1 \end{bmatrix}.$$

As shown in FIG. 5, subsequent to precoding 508, layer demapping 510, modulation demapping 512, and descrambling 514, 515 operations may be employed to further manipulate signals RX0 and RX1. In a preferred embodiment, the descrambling 514, 515 in both chains sets q=0 for both of the RX0 and RX1 signals, as further addressed below. Upon descrambling, signals RX0 and RX1 may be subject to channel decoding 516, 517 and a cyclic redundancy check 518 to generate block error rate results (BLER) 520, 522 for both RX chains RX0 and RX1, respectively.

Figure 6:
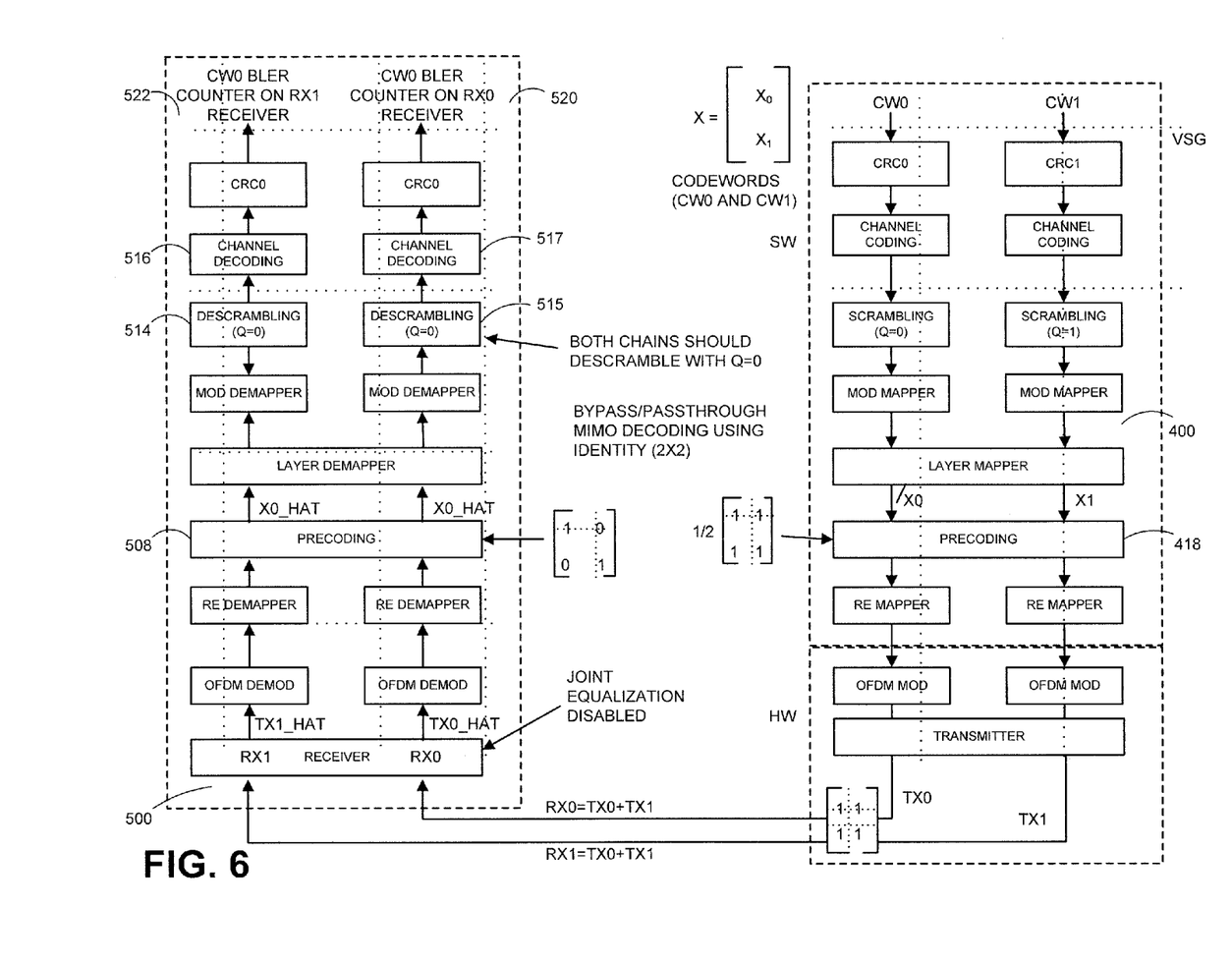
FIG. 6 illustrates a complete test design utilizing a single VSG and 2x2 MIMO DUT configured to fully test the RX and decoding chains of the DUT according to an exemplary disclosed embodiment.

Referring to FIG. 6, the entire test configuration is shown including the single VSG 400, VSG output signals TX0, TX1, the channel transformation into RX0 (TX0+TX1) and RX1 (TX0+TX1) for both signals (TX0 and TX1, respectively), and the resulting BLER results 520, 522 for both RX chains. The overall end-to-end result (from the input of precoding 418 at the VSG 400 to the output of precoding 508 at the DUT 500) is described by the following expression:

$$\hat{X} = P_{dut} H^+ H P_{vsg}$$
$$X = \begin{bmatrix} 1 & 0 \\ 0 & 1 \end{bmatrix} \frac{1}{2} \begin{bmatrix} 1 & 1 \\ 1 & 1 \end{bmatrix} \begin{bmatrix} 1 & 1 \\ 1 & 1 \end{bmatrix} \frac{1}{2} \begin{bmatrix} 1 & 1 \\ 1 & -1 \end{bmatrix} \begin{bmatrix} x_1 \\ x_2 \end{bmatrix} = \begin{bmatrix} 1 & 0 \\ 1 & 0 \end{bmatrix} \begin{bmatrix} x_1 \\ x_2 \end{bmatrix} = \begin{bmatrix} x_1 \\ x_1 \end{bmatrix}$$

Where $\hat{X}$ is the CW0 stream scrambled with q=0 sent from the VSG 400 which is not mapped to CW1. CW1 is permitted to stream on the DUT 500 side. The CW0 decoding 517 and BLER reporting 520 is straightforward on the DUT 500 side. However, for CW1, the DUT 500 is configured to preferably descramble 514 the stream with q=0 (instead of q=1) before attempting to decode 516 and report on BLER 522.

Unlike the case wherein a single VSG output is split and fed to each RX (e.g., see FIG. 2), the disclosed invention provides BLER results which take into account the characteristics of the full RX chain, individual noise figures, and channel estimation. In addition, the block error-rate testing provided by the present invention can identify a manufacturing defect affecting MIMO RX with the accuracy of, at least, that of conventional testing systems and methods utilizing additional equipment (such as two VSGs). However, by eliminating the need for a second VSG, the disclosed embodiments provide a more economic testing system and method of operation.

It will be apparent to those skilled in the art that various modifications and variations can be made in the disclosed apparatus and method without departing from the scope of the disclosure. Additionally, other embodiments of the apparatus and method will be apparent to those skilled in the art from consideration of the specification. It is intended that the specification and examples be considered as exemplary only, with a true scope of the disclosure being indicated by the following claims and their equivalents.

The system, as described in the present technique or any of its components, may be embodied in the form of a computer system. Typical examples of a computer system includes a general-purpose computer, a programmed microprocessor, a micro-controller, a peripheral integrated circuit element, and other devices or arrangements of devices that are capable of implementing the steps that constitute the method of the present technique.

The computer system comprises a computer, an input device, a display unit and/or the Internet. The computer further comprises a microprocessor. The microprocessor is connected to a communication bus. The computer also includes a memory. The memory may include Random Access Memory (RAM) and Read Only Memory (ROM). The computer system further comprises a storage device. The storage device can be a hard disk drive or a removable storage drive such as a floppy disk drive, optical disk drive, etc. The storage device can also be other similar means for loading computer programs or other instructions into the computer system. The computer system also includes a communication unit. The communication unit allows the computer to connect to other databases and the Internet through an I/O interface. The communication unit allows the transfer as well as reception of data from other databases. The communication unit may include a modem, an Ethernet card, or any similar device which enables the computer system to connect to databases and networks such as LAN, MAN, WAN and the Internet. The computer system facilitates inputs from a user through input device, accessible to the system through I/O interface.

The computer system executes a set of instructions that are stored in one or more storage elements, in order to process input data. The storage elements may also hold data or other information as desired. The storage element may be in the form of an information source or a physical memory element present in the processing machine.

The set of instructions may include various commands that instruct the processing machine to perform specific tasks such as the steps that constitute the method of the present technique. The set of instructions may be in the form of a software program. Further, the software may be in the form of a collection of separate programs, a program module with a larger program or a portion of a program module, as in the present technique. The software may also include modular programming in the form of object-oriented programming. The processing of input data by the processing machine may be in response to user commands, results of previous processing or a request made by another processing machine.

While the following description is presented to enable a person of ordinary skill in the art to make and use the technique, and is provided in the context of the requirement for a obtaining a patent. The present description is the best presently-contemplated method for carrying out the present technique. Various modifications to the preferred embodiment will be readily apparent to those skilled in the art and the generic principles of the present technique may be applied to other embodiments, and some features of the present technique may be used without the corresponding use of other features. Accordingly, the present technique is not intended to be limited to the embodiment shown but is to be accorded the widest scope consistent with the principles and features described herein.

What is claimed is:

1. A method of testing a communication device by transmitting data packets as a first codeword and a second codeword from a vector signal generator (VSG) to a device under test (DUT), comprising:

manipulating the first codeword and the second codeword by precoding the first codeword and the second codeword;

generating a first output signal and a second output signal from the manipulated first codeword and second codeword, respectively, wherein the first output signal is different than the second output signal;

receiving, by the first DUT, a first signal from the VSG, wherein the first received signal of the DUT is a summation of the first output signal and the second output signal;

receiving, by the DUT, a second signal from the VSG, wherein the second received signal of the DUT is a summation of the first output signal and the second output signal;

manipulating the first received signal of the DUT and the second received signal of the DUT by precoding the first received signal and the second received signal; and generating block error rate results from the manipulated first received signal of the DUT and the manipulated second received signal of the DUT.

2. The method of claim 1, wherein manipulating the first codeword and the second codeword further comprises scrambling the first codeword and the second codeword to create different emulated signals.

3. The method of claim 1, wherein the precoding of the first codeword and the second codeword includes bypass/passthrough decoding utilizing a precoding operator set forth as:

$$\frac{1}{2}\begin{bmatrix} 1 & 1 \\ 1 & -1 \end{bmatrix}$$

based on the pseudo-inverse of a channel $$H = \begin{bmatrix} 1 & 1 \\ 1 & 1 \end{bmatrix}.$$

4. The method of claim 1, wherein manipulating the first codeword and the second codeword further includes one or more of a cyclic redundancy check, channel coding, modulation mapping, layer mapping, RE mapping, and orthogonal frequency-division multiplexing modulation of the first codeword and the second codeword.

5. The method of claim 1, wherein the precoding of the first received signal of the DUT and the second received signal of the DUT includes bypass/passthrough decoding utilizing a precoding operator set forth as:

$$\begin{bmatrix} 1 & 0 \\ 0 & 1 \end{bmatrix}.$$

6. The method of claim 1, wherein manipulating the first received signal of the DUT and the second received signal of the DUT further includes one or more of orthogonal frequency-division multiplexing demodulation, RE demapping, layer demapping, modulation demapping, channel decoding, and a cyclic redundancy check of the first received signal of the DUT and the second received signal of the DUT.

7. The method of claim 1, wherein manipulating the first received signal of the DUT and the second received signal of the DUT further comprises descrambling the first received signal of the DUT and the second received signal of the DUT.

8. A system for testing a communication device by transmitting data packets as a first codeword and a second codeword from a vector signal generator (VSG) to a device under test (DUT), comprising:

means for manipulating the first codeword and the second codeword by precoding the first codeword and the second codeword;

means for generating a first output signal and a second output signal from the manipulated first codeword and second codeword, respectively, wherein the first output signal is different than the second output signal;

means for receiving, by the DUT, a first signal from the VSG, wherein the first received signal of the DUT is a summation of the first output signal and the second output signal;

means for receiving, by the DUT, a second signal from the VSG, wherein the second received signal of the DUT is a summation of the first output signal and the second output signal;

means for manipulating the first received signal of the DUT and the second received signal of the DUT by precoding the first received signal and the second received signal; and means for generating block error rate results from the manipulated first received signal of the DUT and the manipulated second received signal of the DUT.

9. The system of claim 8, further comprising means for scrambling the first codeword and the second codeword to create different emulated signals.

10. The system of claim 8, wherein the means for manipulating the first codeword and the second codeword includes means for bypass/passthrough decoding utilizing a precoding operator set forth as:

$$\frac{1}{2}\begin{bmatrix} 1 & 1 \\ 1 & -1 \end{bmatrix}$$

based on the pseudo-inverse of a channel $$H = \begin{bmatrix} 1 & 1 \\ 1 & 1 \end{bmatrix}.$$

11. The system of claim 8, wherein the means for manipulating the first codeword and the second codeword further includes means for one or more of performing a cyclic redundancy check, channel coding, modulation mapping, layer mapping, RE mapping, and orthogonal frequency-division multiplexing modulation of the first codeword and the second codeword.

12. The system of claim 8, wherein the means for manipulating the first received signal of the DUT and the second received signal of the DUT includes means for bypass/passthrough decoding utilizing a precoding operator set forth as:

$$\begin{bmatrix} 1 & 0 \\ 0 & 1 \end{bmatrix}.$$

13. The system of claim 8, wherein the means for manipulating the first received signal of the DUT and the second received signal of the DUT further includes means for one or more of performing orthogonal frequency-division multiplexing demodulation, RE demapping, layer demapping, modulation demapping, channel decoding, and a cyclic redundancy check of the first received signal of the DUT and the second received signal of the DUT.

14. The system of claim 8, wherein the means for manipulating the first received signal of the DUT and the second received signal of the DUT includes means for descrambling the first received signal of the DUT and the second received signal of the DUT.

* * * * *